(12) United States Patent
Chang

(10) Patent No.: US 9,263,398 B1
(45) Date of Patent: Feb. 16, 2016

(54) SEMICONDUCTOR PACKAGING IDENTIFIER

(71) Applicant: Cypress Semiconductor Corporation, San Jose, CA (US)

(72) Inventor: Bo Soon Chang, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/679,218

(22) Filed: Apr. 6, 2015

Related U.S. Application Data

(63) Continuation of application No. 12/057,648, filed on Mar. 28, 2008, now Pat. No. 8,999,752.

(60) Provisional application No. 60/921,153, filed on Mar. 30, 2007.

(51) Int. Cl.
*H01L 23/544* (2006.01)
*H01L 23/495* (2006.01)
*H01L 23/00* (2006.01)
*H01L 21/48* (2006.01)

(52) U.S. Cl.
CPC .......... *H01L 23/544* (2013.01); *H01L 21/4828* (2013.01); *H01L 23/49503* (2013.01); *H01L 23/49541* (2013.01); *H01L 23/49579* (2013.01); *H01L 24/49* (2013.01); *H01L 2223/5442* (2013.01); *H01L 2223/54413* (2013.01); *H01L 2223/54433* (2013.01); *H01L 2223/54486* (2013.01); *H01L 2224/48247* (2013.01); *H01L 2924/14* (2013.01); *H01L 2924/17747* (2013.01)

(58) Field of Classification Search
CPC ............ H01L 23/544; H01L 2223/544; H01L 2223/54406; H01L 2223/54413; H01L 2223/5442; H01L 2223/54433; H01L 2223/54493

See application file for complete search history.

(56) References Cited

U.S. PATENT DOCUMENTS

| | | | |
|---|---|---|---|
| 5,672,547 A | 9/1997 | Jeng et al. | |
| 6,335,564 B1 | 1/2002 | Pour | |
| 6,790,682 B2 * | 9/2004 | Fujiwara | H01L 21/67144 156/378 |
| 7,405,106 B2 * | 7/2008 | Maloney | H01L 23/3107 257/E23.037 |
| 2003/0006055 A1 | 1/2003 | Chien-Hung et al. | |
| 2003/0062604 A1 * | 4/2003 | Uebayashi | H01L 23/49503 257/666 |

OTHER PUBLICATIONS

USPTO Advisory Action for U.S. Appl. No. 12/057,648 dated Feb. 10, 2014; 3 pages.
USPTO Notice of Allowance for U.S. Appl. No. 12/057,648 dated Jan. 30, 2015; 10 pages.
USPTO Non-Final Rejection for U.S. Appl. No. 12/057,648 dated Aug. 9, 2010; 5 pages.
USPTO Final Rejection for U.S. Appl. No. 12/057,648 dated Oct. 10, 2013; 9 pages.
USPTO Final Rejection for U.S. Appl. No. 12/057,648 dated Oct. 20, 2011; 7 pages.
USPTO Final Rejection for U.S. Appl. No. 12/057,648 dated Nov. 17, 2014; 9 pages.

(Continued)

*Primary Examiner* — Jae Lee

(57) ABSTRACT

Described is a semiconductor package frame including a material comprising wire openings a die-mounting surface area with a die-mounting surface and identification markings included within the die-mounting surface. The identification markings uniquely identify the semiconductor package frame from among other semiconductor package frames comprising different identification markings.

20 Claims, 8 Drawing Sheets

(56) References Cited

OTHER PUBLICATIONS

USPTO Final Rejection for U.S. Appl. No. 12/057,648 dated Dec. 30, 2010; 6 pages.
USPTO Non Final Rejection for U.S. Appl. No. 12/057,648 dated Jul. 3, 2014; 9 pages.
USPTO Non-Final Rejection for U.S. Appl. No. 12/057,648 dated Jul. 19, 2013; 8 pages.
USPTO Non-Final Rejection for U.S. Appl. No. 12/057,648 dated Jun. 7, 2011; 6 pages.

* cited by examiner

SEMICONDUCTOR PACKAGING IDENTIFIER

CROSS-REFERENCE TO RELATED APPLICATIONS

This application is a continuation of U.S. patent application Ser. No. 12/057,648, filed Mar. 28, 2008, which claims priority to U.S. Provisional Patent Application No. 60/921,153, filed Mar. 30, 2007, all of which are incorporated by reference herein in their entirety.

FIELD OF INVENTION

Embodiments of the present invention relate to semiconductor packaging technology.

BACKGROUND OF THE INVENTION

Conventional semiconductor package frames ("lead frames") have a plurality of openings for wires to pass through and an area for mounting the die (or chip) which is know as a paddle. FIG. 1 shows a conventional semiconductor frame 100. Semiconductor frame 100 includes plurality of holes 102 and paddle area 104. Plurality of holes 102 provide spacing for wires to pass through semiconductor frame 100. Paddle area 104 provides a surface for mounting of the die or chip. The wires that pass through plurality of holes 102 connect the die to pins which are attached during subsequent stages of the semiconductor packaging process and facilitate the semiconductor package to be connected and mounted to a printed circuit board.

Semiconductor frames are often made initially from a single piece of material in large quantity and then individually cut into strips ("lead frame strips") or rows and then cut into individual semiconductor frames. During manufacturing, there are often controllable and uncontrollable variances which may result in defective elements or components in semiconductor packages. In order eliminate and track down these variances, there is a need to identify and track the conditions under which a semiconductor package was manufactured. In the device 100, the strip form is often marked uniquely identifying the parts. Individual frame are not marked. Therefore, once the strip is separated into the component frames, the identifiers are no longer associated with the individual frames.

FIG. 2 shows another conventional semiconductor frame design 200. Semiconductor frame 200 includes plurality of openings 202, paddle area 204, and identification area 206. Similar to design 100, plurality of openings 202 allows for wires to pass through semiconductor frame 200. The wires that pass through plurality of openings 202 to connect the die to pins which are attached during subsequent steps of the semiconductor packaging process and allow the semiconductor package to be connected and/or mounted to a printed circuit board. Paddle area 204 provides a surface for mounting the die. Paddle area 204 is substantially smaller than paddle area 104 to make room for identification areas 206. Identification areas 206 provide an area for printing tracking information such as letters or numbers to identify the unique semiconductor package. This allows tracking of a particular semiconductor frame, not just the strip from which it originated. Design 200 is problematic because the reduced paddle size of 204 means that dies must be redesigned to fit within the smaller non-standard area and also associated equipment may need to be reconfigured or retooled.

SUMMARY OF THE INVENTION

Accordingly, embodiments of the present invention are directed to a semiconductor packaging frame allowing identification information to be stored e.g., printed, pressed, etc. in the paddle area of the individual frame. Forming identification information on the paddle allows unique tracking of the semiconductor frame package during and after manufacturing and tracking down variances or defects during the semiconductor packaging process. It is appreciated that, the identification techniques used herein do not reduce the size of the paddle area in contrast to the conventional techniques described above. Further, the shapes formed from the identification information provide increased surface area for bonding of the molding compound and thus strengthen the bond between the die paddle and molding compound thereby improving the strength of the semiconductor package.

More specifically, an embodiment of the present invention is directed to a method for forming a semiconductor package frame and includes forming a plurality of openings for wires in a material, determining identification information, and forming a plurality of markings in a paddle area of the material based on the identification information. The semiconductor packaging frame provides a full sized die paddle and allows for the storing of a plurality of identification information on the paddle for quality control and tracking during and after manufacturing.

Another embodiment of the present invention is directed to a lead frame. The lead frame includes a plurality of conductive fingers between a plurality of openings. The plurality of conductive fingers may facilitate the connection of a plurality of wires to a die. The lead frame further includes a paddle area coupled to the plurality of fingers and the paddle area comprises identification information to identify the lead frame.

Another embodiment of the present invention is directed to a packaged integrated circuit. The packaged integrated circuit includes a plurality of pins which are operable to couple the packaged integrated circuit to a circuit board. The packaged integrated circuit further includes a plurality of wires which are operable to couple a die, including an integrated circuit, with the plurality of pins. The die may be mounted upon a paddle area of a lead frame. In one embodiment, the entire paddle area is operable to comprise identification information.

DESCRIPTION OF THE INVENTION

Reference will now be made in detail to the preferred embodiments of the claimed subject matter, examples of which are illustrated in the accompanying drawings. While the invention will be described in conjunction with the preferred embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the claims. Furthermore, in the detailed description of the present invention, numerous specific details are set forth in order to provide a thorough understanding of the claimed subject matter. However, it will be obvious to one of ordinary skill in the art that the claimed subject matter may be practiced without these specific details. In other instances, well known methods, procedures, components, and circuits have not been described in detail as not to unnecessarily obscure aspects of the claimed subject matter.

EXAMPLE PACKAGING APPARATUS

Figure 1:
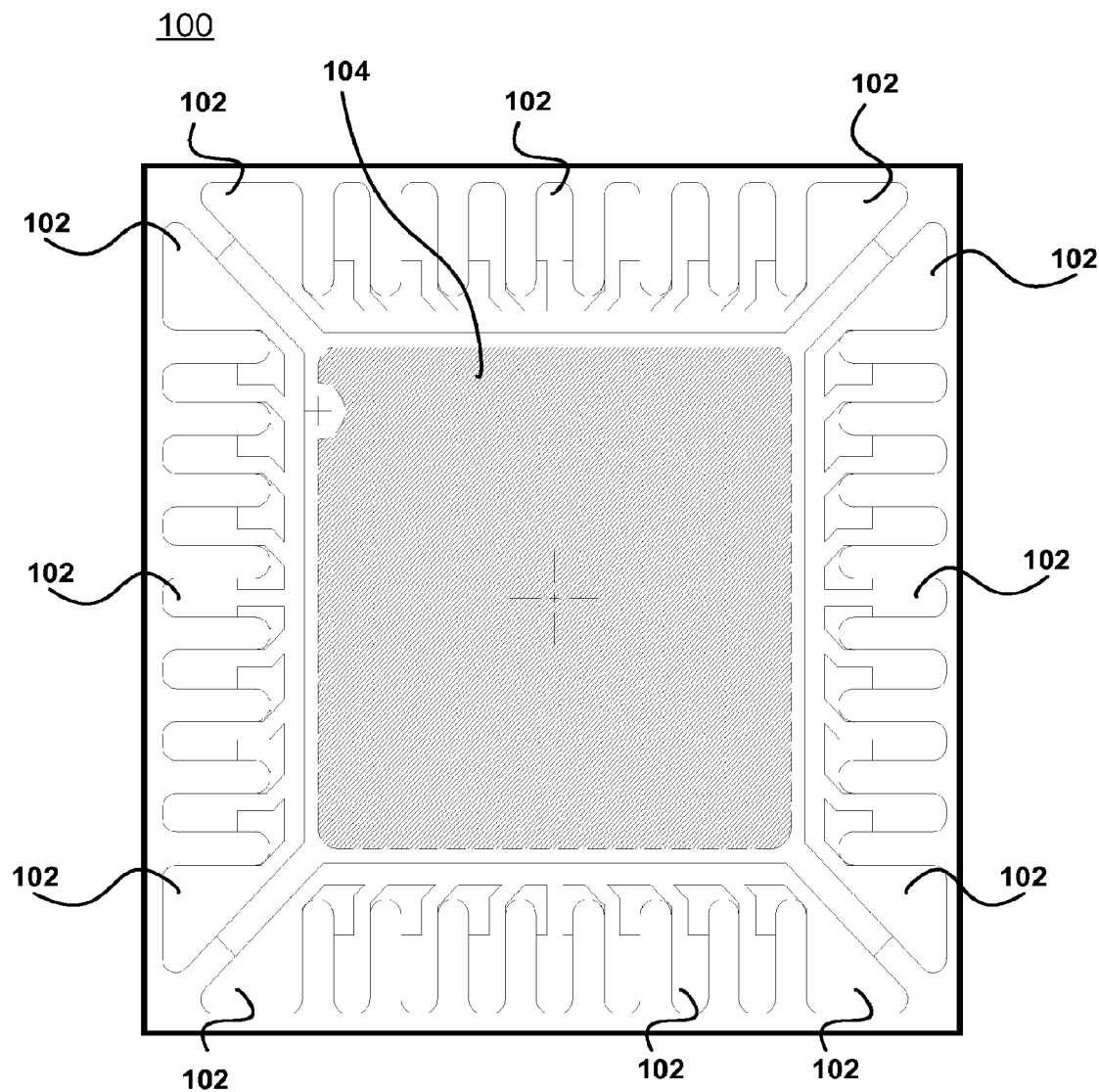
FIG. 1 shows a conventional semiconductor packaging frame design.
Figure 2:
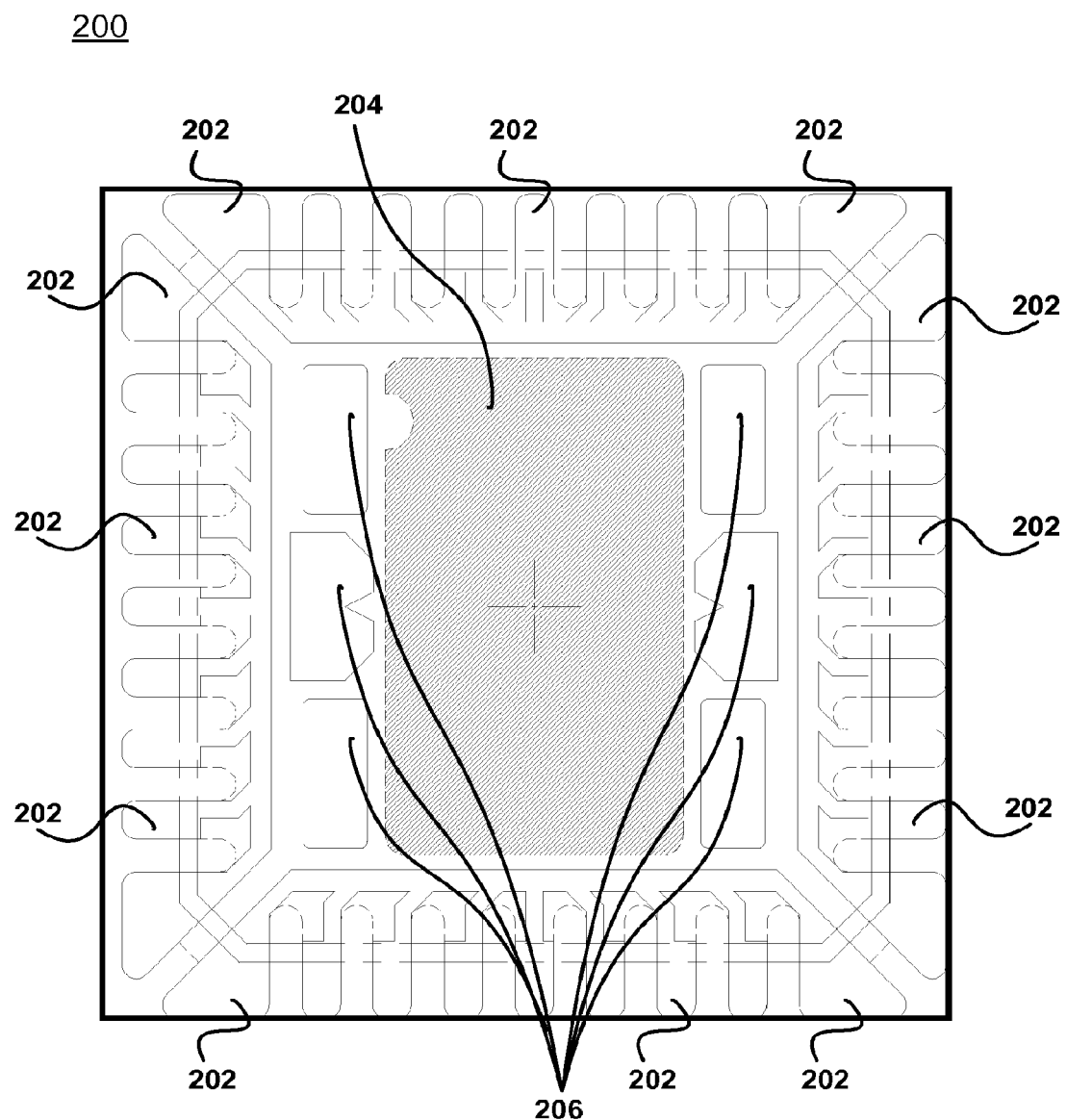
FIG. 2 shows another conventional semiconductor packaging frame design.
Figure 3:
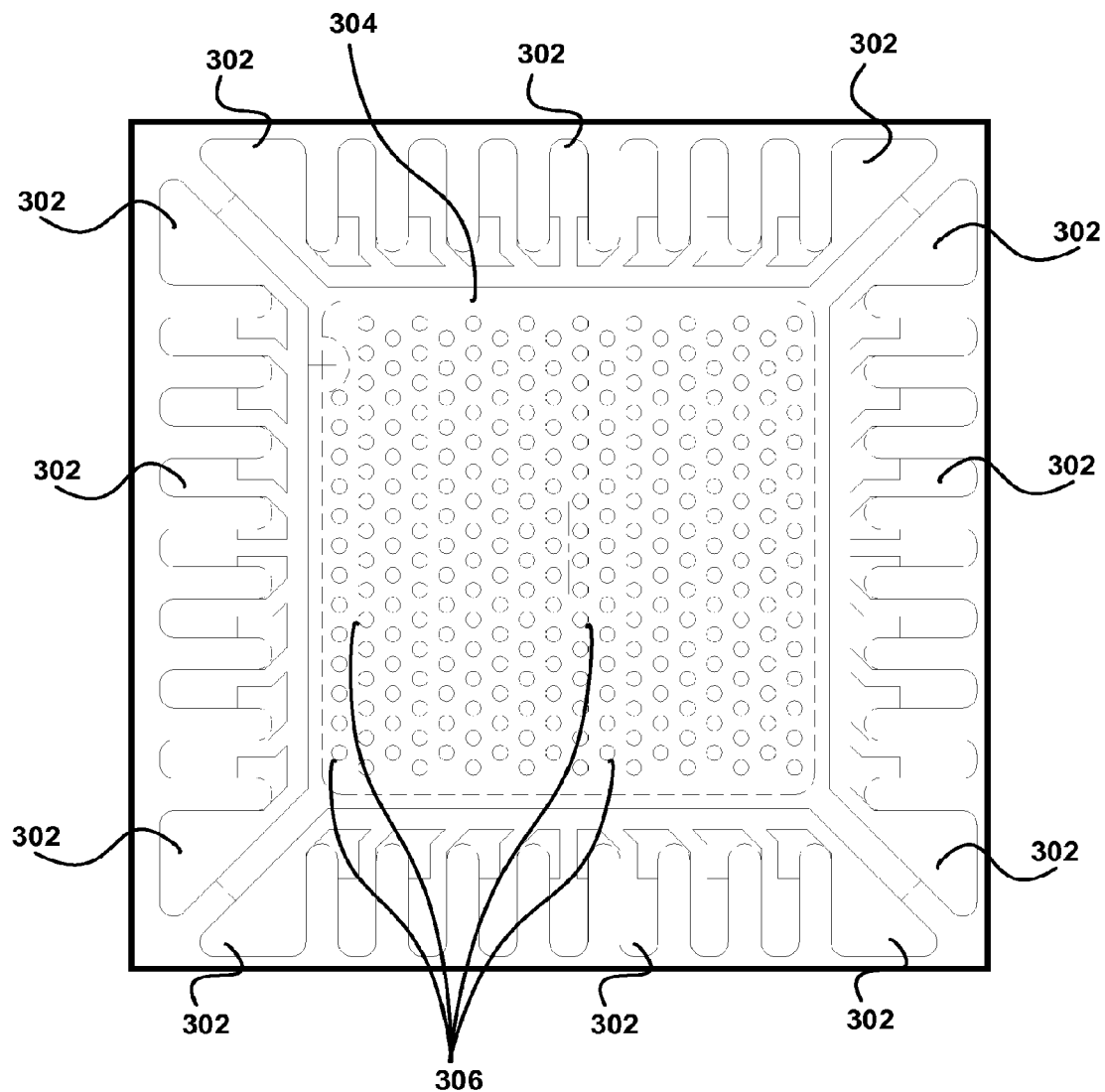
FIG. 3 shows a top view of an exemplary semiconductor packaging frame, in accordance with an embodiment of the present invention.

FIG. 3 illustrates example components used by various embodiments of the present invention. Although specific components are disclosed in apparatus 300 it should be appreciated that such components are examples. That is, embodiments of the present invention are well suited to having various other components or variations of the components recited in packaging apparatus 300. It is appreciated that the components in apparatus 300 may operate with other components than those presented, and that not all of the components of apparatus 300 may be required to achieve the goals of apparatus 300. In one embodiment, apparatus 300 or semiconductor frame 300 may be made of metal, (e.g., copper). Device 300 is shown as separated, but it is appreciated that many frames may also exist bound in strip form for transport and manufacturing. Further, semiconductor frame 300 may be made for use in a quad flat package with no lead. Semiconductor lead frame 300 includes plurality of openings 302, paddle area 304, and plurality of markings 306.

Plurality of openings 302 provides spacing for wires to pass through semiconductor frame 300. Paddle area 304 fully extends across the frame surface that is not reserved for wires and provides a surface for mounting of the die and further packaging of the die. The wires that pass through plurality of openings 302 connect the die to pins which are attached during subsequent steps of the semiconductor packaging process and allow the semiconductor package to be connected and mounted to a printed circuit board.

As discussed, paddle area 304 is a full sized paddle area in that paddle area 304 uses the entire area available of semiconductor frame 300 not occupied and surrounding plurality of openings 302. In accordance with embodiments of the present invention, markings 306 may be made throughout the full area of paddle area 304. Markings 306 may be made by etching the material of semiconductor design 300. In one embodiment, markings 306 are dimples which may extend halfway through the material of semiconductor device 300. For example, if semiconductor frame 300 is made of a material that is 200 microns thick then markings 306 may be dimples which extend up to 100 microns into semiconductor frame 300. The dots may be arranged into patterns for unique identification, e.g., binary codes, dot matrix characters, etc.

In other embodiments, markings 306 may be a plurality of shapes or designs including, but not limited to, triangles, squares, and strips. Markings 306 may be configured in a plurality of ways to uniquely identify each semiconductor frame 300. It is appreciated that the presence or absence of various portions of markings 306 may be used to uniquely identify each semiconductor frame 300 manufactured. Markings 306 further provide more surface area for molding compound to bond with and thus improve the bond strength between paddle area 304 and the molding compound. In one embodiment, the increase in surface area allows the semiconductor packaging to beneficially maintain moisture sensitivity level 1 for lead-free reflow at 260 degrees C.

In one embodiment, markings 306 are visible via X-ray imagery of the assembled semiconductor package. Markings 306 are also visible by removing various elements added throughout subsequent steps in the semiconductor packaging process. It is appreciated that markings 306 may be visible in other ways besides those described herein and are not intended to be limited as such. The various ways of detecting and/or viewing markings 306 allows identification or tracing of each semiconductor frame and the associated position during production of the semiconductor package. This identification allows tracking of semiconductor frame 300 throughout the semiconductor packaging process and can be used to track down variances and other problems during the semiconductor packaging assembly process.

As discussed above, the discrete dimples used for marking may be arranged to resemble alpha numeric characters, e.g., analogous to dot matrix printing techniques. Alternatively, the markings may be arranged in a coded pattern technique, such as bar coding, or binary coded patterns.

EXAMPLE OPERATIONS

Figure 4:
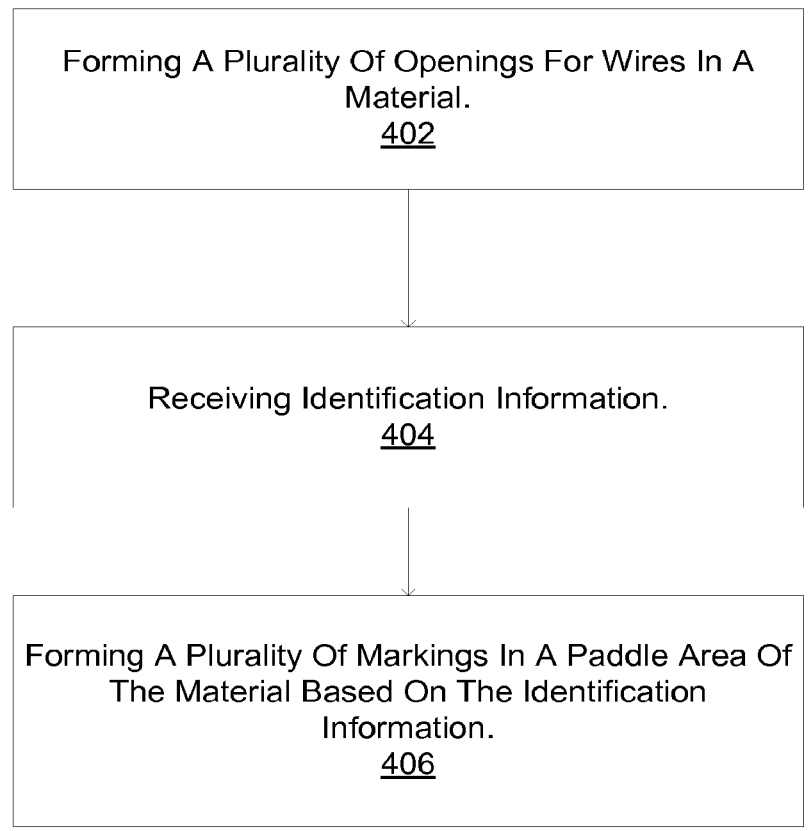
FIG. 4 is a flowchart of a process for forming a semiconductor packaging frame, in accordance with another embodiment of the present invention.

With reference to FIG. 4, flowchart 400 illustrates example functions used by various embodiments of the present invention for marking the paddle area of a frame. Flowchart 400 includes processes that, in various embodiments, are carried out during the assembly of a semiconductor package. Although specific function blocks ("blocks") are disclosed in flowchart 400, such steps are examples. That is, embodiments are well suited to performing various other blocks or variations of the blocks recited in flowchart 400. It is appreciated that the blocks in flowchart 400 may be performed in an order different than presented, and that not all of the blocks in flowchart 400 may be performed.

FIG. 4 is a flowchart 400 of an exemplary process forming a semiconductor packaging frame or lead frame, in accordance with an embodiment of the present invention. The blocks of flowchart 400 may be carried out on a device or plurality of devices used for a variety of functions including, but not limited to, assembling semiconductor packages. In one embodiment, the blocks of flowchart 400 are used in the assembly of a Quad Flat Package with No lead (QFN). The blocks of flowchart 400 facilitate the creation of a semiconductor frame for holding a die, containing unique identification information for identifying and tracking a semiconductor frame both during and after assembly of a semiconductor package. Further, the blocks of flowchart 400 increase the surface area between the die paddle and the molding compound and thereby improve the strength of the bond between the die paddle and the molding compound. The semiconductor packaging frame or lead frame may be processed through standard die attachment, wire bonding, molding, and lead cut singulation after the process described by flowchart 400.

At block 402, a plurality of openings for wires are formed in the material of a semiconductor frame. The wires pass through the plurality of openings to connect the die to pins which are attached to semiconductor package during subsequent semiconductor packaging steps. The pins then allow the semiconductor package to be connected and/or mounted to a printed circuit board.

At block 404, identification information is received. The identification information may be unique to each semiconductor frame and used throughout and after the semiconductor packaging process to track semiconductor packages. The identification may be unique to the frame and may represent process conditions relevant to manufacture of the component. The identification information may be stored in a database or other data storage structure or on a computer readable medium for identifying and tracking each semiconductor package.

At block 406, a plurality of markings are formed in the paddle area based on the identification information. The plurality of markings may be made throughout the complete paddle area. The plurality of markings may be made by etching the material of the paddle area of the semiconductor frame using semiconductor processes. For example, the etching may be done by chemical etching. In one embodiment, the plurality of markings are dimples which may extend halfway through the material of semiconductor frame. For example, if semiconductor frame is made of a material that is 150 microns thick then the plurality of markings may be dimples which extend up to 75 microns into semiconductor frame. The dimples may be used to encode information in a dot matrix format.

In other embodiments, the plurality of markings may be a plurality of shapes or designs including, but not limited to, triangles, squares, and strips. It is appreciated that the presence or absence of various portions of the plurality of markings may be used to uniquely identify each semiconductor frame or a die to be attached thereto. The plurality of markings further provide more surface area for bonding of molding compound and thus improve the bonding strength between the paddle area and the molding compound. In one embodiment, this increase in surface area allows the semiconductor packaging to maintain moisture sensitivity level 1 for lead-free reflow at 260 degrees C.

In one embodiment, the plurality of markings are visible via X-ray imagery of the assembled semiconductor package. The plurality of markings are also visible by removing various elements or components added throughout the subsequent steps of the semiconductor packaging process. It is appreciated that the plurality of markings may be visible in other ways besides those described herein and are not intended to be limited as such. The various ways of viewing the plurality of markings allows identification of each semiconductor frame and the associated position during production of the semiconductor package. This identification can be used to track down variances, defects, and other problems that occurred during the semiconductor packaging assembly process. The plurality of markings or identification information can be used to map defects trends of the lead frame format. Thus, the identification information provides a better root cause analysis via dot matrix mapping. If there are no problems or defects, there will be little need to trace the lead frame based on the identification information.

Figure 5:
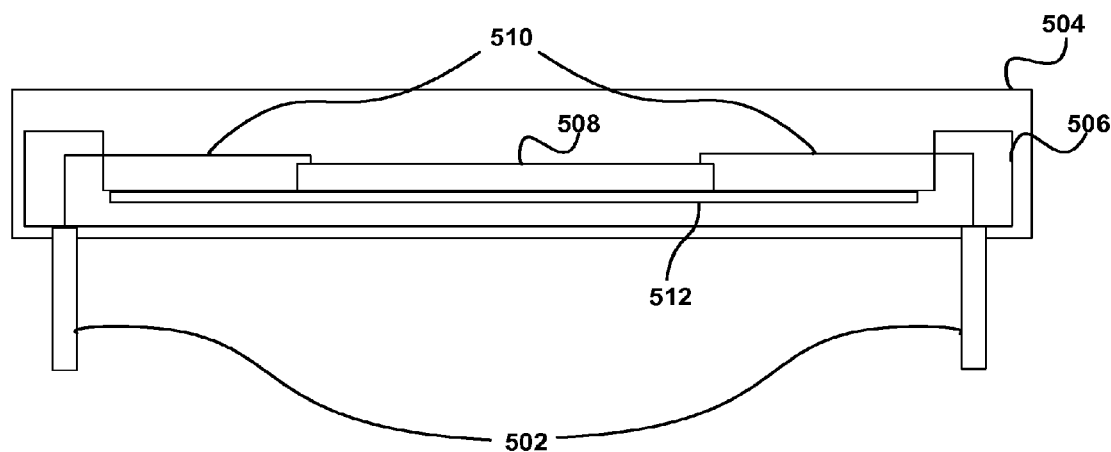
FIG. 5 shows an exemplary packaged integrated circuit, in accordance with an embodiment of the present invention.

FIG. 5 shows an exemplary packaged integrated circuit, in accordance with an embodiment of the present invention. Packaged integrated circuit 500 includes plurality of pins 502, encapsulation material 504, lead frame 506, die 508, and plurality of wires 510. Plurality of wires 510 couple die 508 with pins 502. Pins 502 facilitate communication of die 508 with devices coupled to packaged integrated circuit 500 (e.g., other integrated circuits coupled to a circuit board). Encapsulation material 504 provides structure and protection for integrated circuit of die 508.

Lead frame 506 includes paddle area 512 for mounting die 508. In one embodiment, paddle area 512 is operable to comprise identification information as described herein which can be used to identify and track packaged integrated circuit 500 during and after manufacturing. For example, paddle area 512 may include identification information encoded as a dot matrix.

Figure 6:
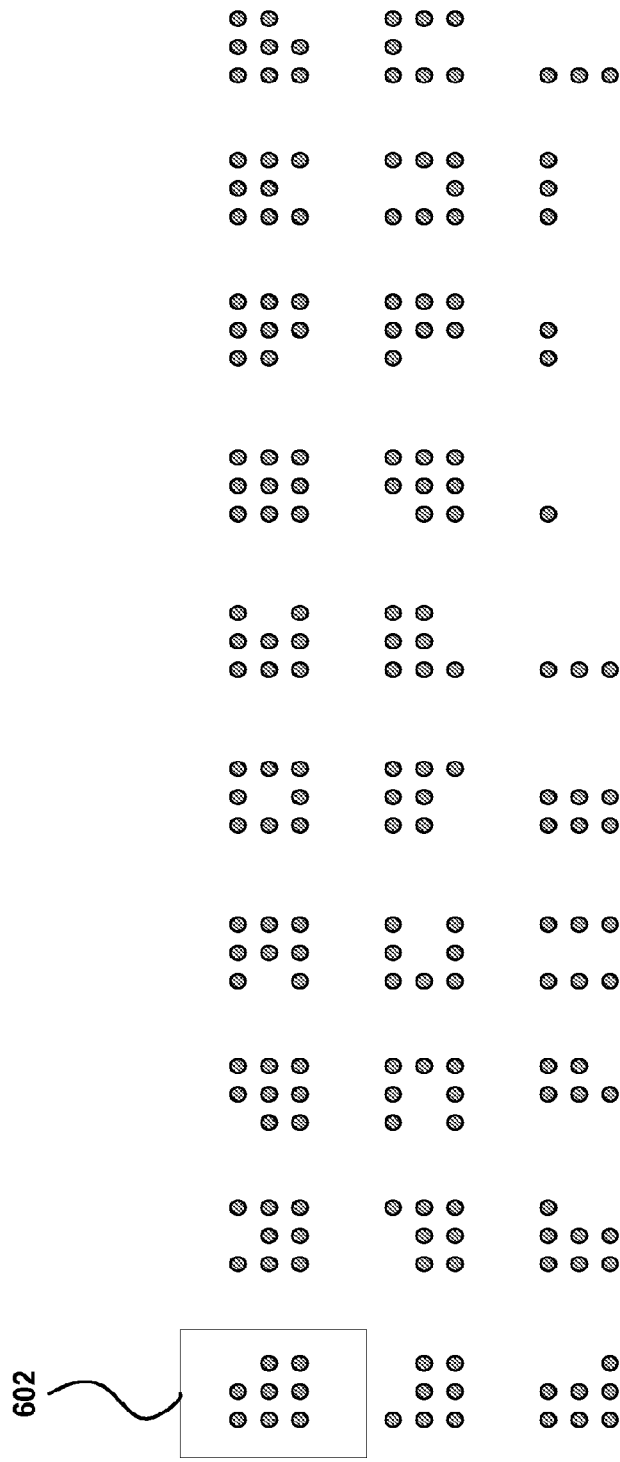
FIG. 6 shows exemplary identification information, in accordance with an embodiment of the present invention.

FIG. 6 shows exemplary identification information that may be placed on the paddle area of a frame. The identification information may be encoded and may be orientated in a dot matrix or binary format. The presence and absence may both be used to encode information. Encoding 602 is one possible configuration or orientation of identification information. In one exemplary embodiment, each dot matrix or group of codings may be dedicated or assigned to each die paddle. The dot matrix may be formed by half etched dimples as described herein.

Figure 7A:
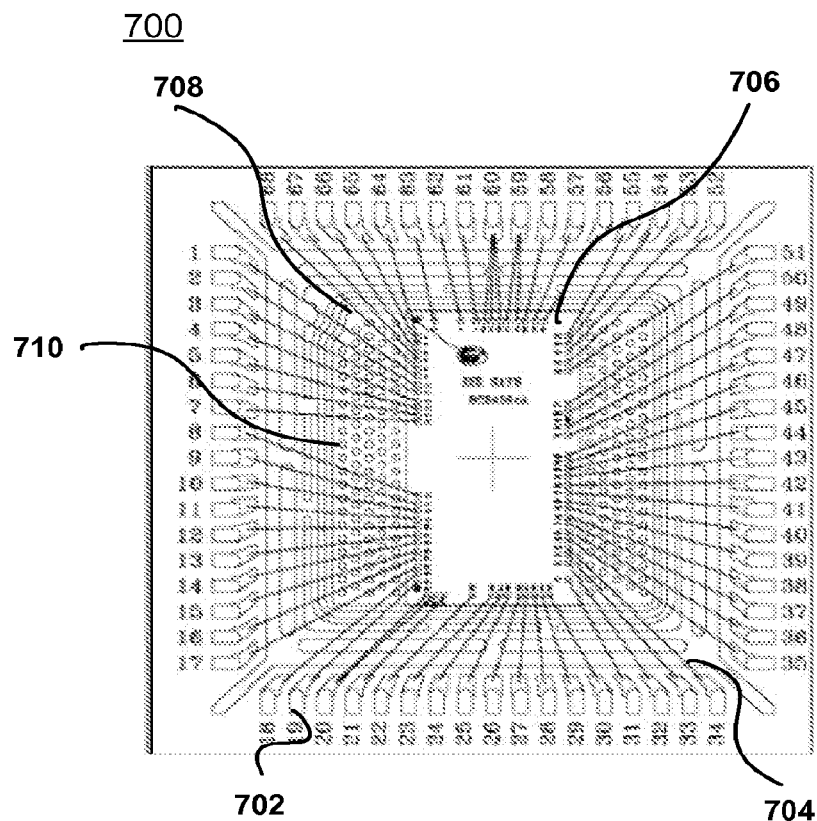
FIG. 7A shows a block diagram of an exemplary semiconductor package, in accordance with another embodiment of the present invention.

FIG. 7A shows a diagram of an exemplary semiconductor package, in accordance with an embodiment of the present invention. Semiconductor package 700 includes openings 702, wires 704, die 706, paddle 708 and identification information 710.

Figure 7B:
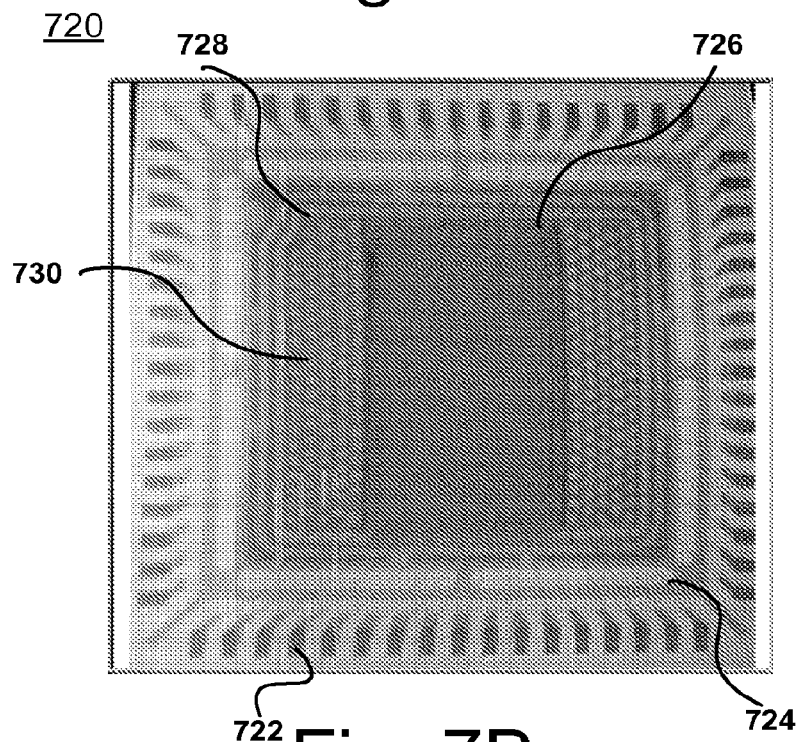
FIG. 7B shows an x-ray image of an exemplary semiconductor package, in accordance with another embodiment of the present invention.

FIG. 7B shows an x-ray image an exemplary semiconductor package, in accordance with an embodiment of the present invention. Semiconductor package 720 includes openings 722, wires 724, die 726, paddle 728 and identification information 730. Identification information 730 is visible on the x-ray image and may be used to identify the lead frame.

Figure 8A:
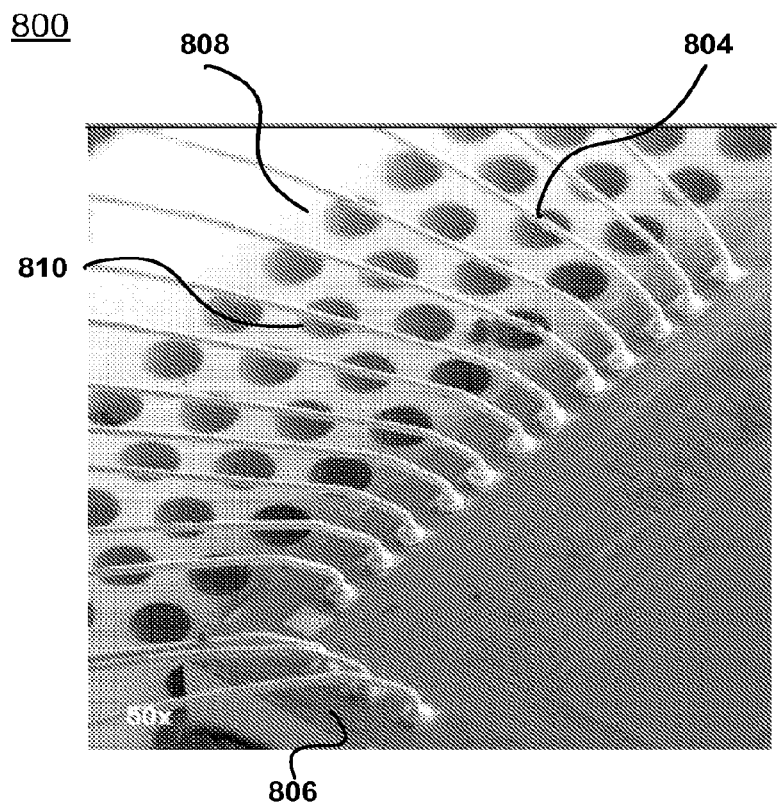
FIGS. 8A and 8B show close up images of an exemplary lead frame at various stages of a semiconductor packaging process, in accordance with another embodiment of the present invention.

FIG. 8A shows a close up image of an exemplary semiconductor package at one stage during the semiconductor packaging process, in accordance with an embodiment of the present invention. Semiconductor package 800 includes wires 804, die 806, paddle 808, and identification information 810. Die 806 has been bonded to paddle 808 and wires 824 have been bonded to die 806.

Figure 8B:
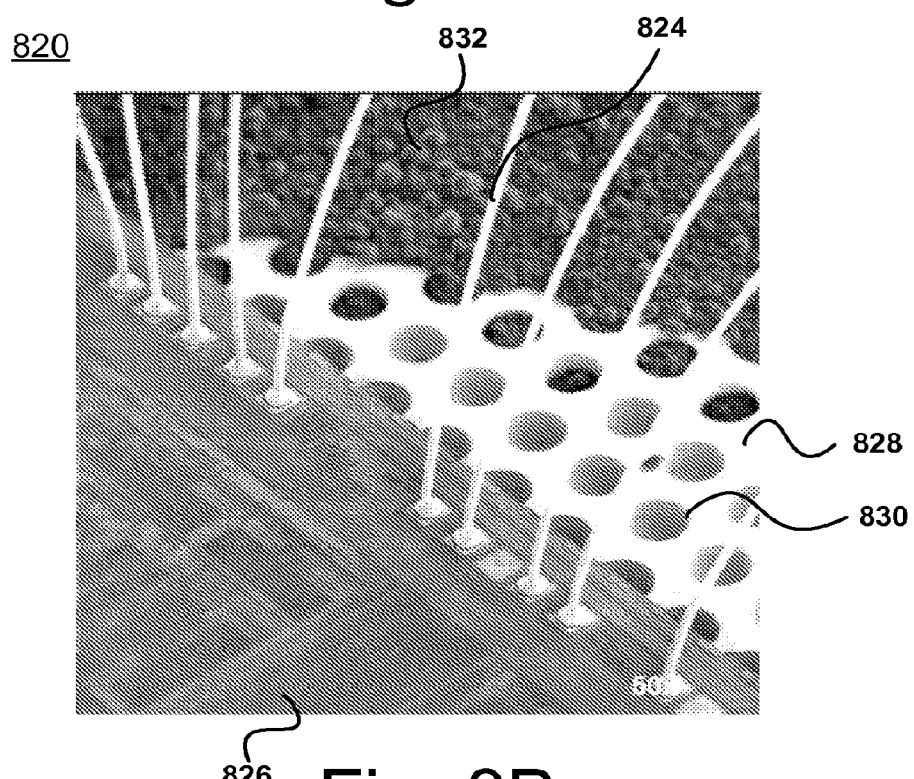

FIG. 8B shows a close up image of an exemplary semiconductor package at another stage during the semiconductor packaging process, in accordance with an embodiment of the present invention. Semiconductor package 820 includes wires 824, die 826, paddle 828, identification information 830, and molding compound 832. Molding compound may fill in and bond to the increased surface area formed by identification information 830. The increase in surface area strengthens the bond between the molding compound 832 and paddle 828.

Thus, embodiments of the present invention allow unique identification and tracking of semiconductor packages throughout and after the semiconductor packaging process. Further, embodiments increase the surface area between the die paddle and the molding compound and therefore increase the strength of the overall semiconductor package. Thus, a substantial improvement in traceability and thus quality control is achieved.

Embodiments of the present invention are thus described. While the present invention has been described in particular embodiments, it should be appreciated that the present invention should not be construed as limited by such embodiments, but rather construed according to the below claims.

What is claimed is:

1. A semiconductor package frame comprising:
a material comprising a plurality of wire openings;
a die-mounting surface area comprising a die-mounting surface; and
a plurality of identification markings included within the die-mounting surface, the plurality of identification markings to uniquely identify the semiconductor package frame from among other semiconductor package frames comprising different identification markings.

2. The semiconductor package frame of claim 1, wherein the semiconductor package frame accommodates a Quad Flat package with no lead.

3. The semiconductor package frame of claim 1, wherein the die-mounting surface area comprises copper.

4. The semiconductor package frame of claim 1, wherein the identification markings are dimples that extend through the die-mounting surface area at least halfway.

5. The semiconductor package frame of claim 1, wherein the identification markings are individual binary coded markings.

6. The semiconductor package frame of claim 1, wherein the identification markings resemble alpha numeric characters.

7. The semiconductor package frame of claim 1, wherein the identification markings are individual dot matrix characters.

8. The semiconductor package frame of claim 1, wherein the identification markings are visible via X-ray imagery.

9. The semiconductor package frame of claim 1, further comprising a plurality of conductive fingers.

10. An integrated circuit package comprising:
a plurality of pins;
a plurality of wires coupled to the pins;
an integrated circuit die coupled to the plurality of wires;
a lead frame comprising:
a material comprising a plurality of wire openings;
a die-mounting surface area comprising a die-mounting surface; and
a plurality of identification markings included within the die-mounting surface, the plurality of identification markings to uniquely identify the lead frame from among other lead frames comprising different identification markings.

11. The integrated circuit package of claim 10, wherein the lead frame accommodates a Quad Flat package with no lead.

12. The integrated circuit package of claim 10, wherein the die-mounting surface area comprises copper.

13. The integrated circuit package of claim 10, wherein the identification markings are dimples that extend through the die-mounting surface area at least halfway.

14. The integrated circuit package of claim 10, wherein the identification markings are individual binary coded markings.

15. The integrated circuit package of claim 10, wherein the identification markings resemble alpha numeric characters.

16. The integrated circuit package of claim 10, wherein the identification markings are individual dot matrix characters.

17. The integrated circuit package of claim 10, wherein the plurality of identification markings are visible via X-ray imagery.

18. The integrated circuit package of claim 10, wherein the lead frame further comprises a plurality of conductive fingers disposed between the plurality of openings in the material.

19. A method for forming a lead frame comprising:
forming a plurality of wire openings in a material;
receiving identification information; and
forming a plurality of identification markings on a die-mounting surface within a die-mounting surface area of the material based on the identification information, wherein the die-mounting surface area comprises a die-mounting surface for mounting a die, the plurality of identification markings to uniquely identify the semiconductor package frame from among other semiconductor package frames comprising different identification markings.

20. The method of claim 19, wherein the plurality of identification markings are formed via an etching process.

* * * * *